(12) United States Patent
Shibayama et al.

(10) Patent No.: US 7,709,085 B2
(45) Date of Patent: May 4, 2010

(54) THERMOSETTING RESIN COMPOSITION, RESIN SHEET AND RESIN SHEET FOR INSULATED SUBSTRATE

(75) Inventors: Koichi Shibayama, Osaka (JP); Koji Yonezawa, Osaka (JP); Kazuyoshi Shiomi, Osaka (JP); Motohiro Yagi, Osaka (JP); Hidenobu Deguchi, Osaka (JP); Nobuhiro Goto, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 666 days.

(21) Appl. No.: 10/581,928

(22) PCT Filed: Dec. 7, 2004

(86) PCT No.: PCT/JP2004/018175

§ 371 (c)(1),
(2), (4) Date: Jun. 7, 2006

(87) PCT Pub. No.: WO2005/056632

PCT Pub. Date: Jun. 23, 2005

(65) Prior Publication Data

US 2008/0233386 A1  Sep. 25, 2008

(30) Foreign Application Priority Data

Dec. 8, 2003 (JP) .............................. 2003-409374

(51) Int. Cl.
B32B 15/16 (2006.01)
C08L 63/00 (2006.01)
C08K 3/24 (2006.01)
B32B 27/20 (2006.01)
B32B 27/38 (2006.01)

(52) U.S. Cl. ................. 428/331; 523/440; 523/443; 523/446; 428/323

(58) Field of Classification Search .............. None
See application file for complete search history.

(56) References Cited

U.S. PATENT DOCUMENTS

| 5,418,266 | A | 5/1995 | Shiobara et al. | |
| 6,160,078 | A | 12/2000 | Osada et al. | |
| 2004/0053061 | A1* | 3/2004 | Yonezawa et al. | 428/458 |
| 2005/0107497 | A1 | 5/2005 | Akaho et al. | |

FOREIGN PATENT DOCUMENTS

| JP | 62-096521 A * | 5/1987 |
| JP | 07-173257 | 7/1995 |
| JP | 10-145020 | 5/1998 |
| JP | 10-324735 | 12/1998 |
| JP | 11-140166 | 5/1999 |
| JP | 11-343323 A * | 12/1999 |
| JP | 2000-183539 | 6/2000 |
| JP | 2001-158817 A * | 6/2001 |
| JP | 2002-241521 | 8/2002 |
| JP | 2002-348469 | 12/2002 |
| JP | 2003-041094 | 2/2003 |
| JP | 2003-313435 | 6/2003 |
| JP | 2003-292787 | 10/2003 |
| JP | 2004-051976 | 2/2004 |
| JP | 2004-176031 | 6/2004 |
| JP | 2004-269853 | 9/2004 |
| TW | 538482 B | 6/2003 |
| TW | 200302851 A | 8/2003 |
| TW | 200305609 A | 11/2003 |
| WO | WO 02/46312 A1 * | 6/2002 |
| WO | WO 03/066740 | 2/2003 |
| WO | WO 03/066741 A1 * | 8/2003 |

OTHER PUBLICATIONS

English Abstract of JP 62-096521, provided by Patent Abstracts of Japan (1987).*
Product Information for D.E.R. 331, provided by Dow (no date).*
Product Information for Epikote 1007, provided by Resolution Performance Products (2004).*
English language abstract of JP 11-343323 A, provided by the JPO (1999).*
English language abstract of JP 2001-158817 A, provided by the JPO (2001).*
International Search Report dated Apr. 5, 2005.
Supplementary European Search Report dated Mar. 23, 2007.
Taiwanese Office Action for the Application No. 093138007 dated May 12, 2008.

* cited by examiner

*Primary Examiner*—Michael J Feely
(74) *Attorney, Agent, or Firm*—Cheng Law Group, PLLC

(57) ABSTRACT

A thermosetting resin composition capable of providing a molding, such as a resin sheet, that excels in not only dielectric characteristics but also dimensional stability at high temperature and even after exposure to high temperature thermal history, exhibits little dimensional change by the thermal history, namely, exhibiting low linear expansion coefficient. There are further provided a resin sheet and resin sheet for insulated substrate produced from the thermosetting resin composition. In particular, there is provided a thermosetting resin composition comprising an epoxy resin of 100 to 2000 epoxy equivalent, an epoxy resin hardening agent consisting of a phenolated compound, and a layered silicate, and are further provided a resin sheet comprised of the thermosetting resin composition and a resin sheet for insulated substrate comprised of the resin sheet.

11 Claims, No Drawings

THERMOSETTING RESIN COMPOSITION, RESIN SHEET AND RESIN SHEET FOR INSULATED SUBSTRATE

This application is a national stage entry of PCT/JP04/18175, filed Dec. 7, 2004, which claims foreign priority to Japanese application No. 2003-409374, filed Dec. 8, 2003.

TECHNICAL FIELD

The present invention relates to a thermosetting resin composition comprised chiefly of an epoxy resin, a resin sheet using the thermosetting resin composition, and a resin sheet for insulating substrate using the resin sheet.

BACKGROUND ART

As recent technology continues to rapidly increase performance, operation and compactness levels of electronic devices, there is an increasing demand to further reduce sizes and weights of electronic parts for use in such electronic devices. Accordingly, there also is a strong demand to further improve properties of electronic part materials, including heat resistance, mechanical strength and electrical properties.

A multilayer printed board for use in electronic devices has plural insulating layers arranged alternately with circuit patterns. Conventionally used for such an insulating layer is a hardened product of a thermosetting resin prepreg made by impregnating a thermosetting resin in a glass cloth, and a resin sheet comprised of a thermosetting or photosetting resin, for example.

It is to be desired that an interlayer spacing of the insulating layers in the multilayer printed board is narrowed considerably to increase a density and a thickness of the multilayer printed board. This raises a need for insulating layers which incorporate a thin glass cloth or consist of a resin containing an inorganic filler. The use of such a thin glass cloth or inorganic filler not only ensures a mechanical strength or other mechanical properties of the multilayer printed board even if having considerably narrow interlayer spacings, but also reduces a dimensional change of the multilayer printed board prior to and subsequent to application of a thermal history, i.e., lowers its linear expansion coefficient (thermal linear expansion coefficient).

Thermosetting resin materials incorporating a large amount of inorganic fillers are conventionally known to constitute such resins containing inorganic fillers that exhibit the above-described functions.

The below-specified Patent Literature 1 discloses a method for fabricating a multilayer printed circuit board (multilayer printed board) by using an epoxy adhesive film as an insulating layer. In the fabrication method described in Patent Literature 1, for example, a bifunctional epoxy resin and a bifunctional phenol in a solvent are polymerized under the presence of a catalyst to obtain a high-molecular weight epoxy polymer having a weight average molecular weight of at least 50,000. Nonfibrous inorganic fillers having a mean particle size of 0.8-5 μm are incorporated in a varnish comprised mainly of the above epoxy polymer, a polyfunctional epoxy resin, a hardener and a crosslinker. This varnish is coated onto one or both surfaces of a support. Subsequent removal of the solvent results in obtaining a multilayer printed circuit board. Patent Literature 1: Japanese Patent Laying-Open No. 2000-183539

DISCLOSURE OF THE INVENTION

In the multilayer printed board made according to the preceding fabrication method, an attempt is made to assure mechanical strength or other mechanical properties of the printed board and lower its linear expansion coefficient by increasing respective interfacial areas between the inorganic filler and high-molecular weight epoxy polymer and between the inorganic filler and polyfunctional epoxy resin sufficiently. However, the insulating layers constituting the multilayer printed board rely on the abundance of inorganic fillers to satisfy the required physical properties. This often impairs their processability and suitability for fabrication processes, resulting in the difficulty to achieve thickness reduction of the insulating layers. Due also to the incorporation of a large amount of inorganic fillers in the insulating layers, the resulting multilayer printed board is often rendered opaque. This results in the difficulty to align its top and back surfaces as by a laser.

On the other hand, the multilayer printed board, either with or without a thin glass cloth, sometimes show insufficient heat resistance and dimensional stability. Also because these multilayer printed boards are brittle and easy to break, a percent defective is relatively higher in a fabrication process. Even in the multilayer printed board using a thin glass cloth, there is an increasing occasion where the glass cloth renders the board opaque. This results in the difficulty to align top and back surfaces of the multilayer printed board as by a laser.

Conventionally, the multilayer printed board has been fabricated such as by a buildup method wherein a sequence of forming an insulating layer and superimposing a circuit pattern on the insulating layer is repeated to buildup a laminated board, or by a single-operation stacking method wherein insulating layers each carrying a circuit pattern thereon are stacked together in a single operation. Due to the increased number of processes involved in either fabrication method, the quality of the material used tends to affect largely on the yield.

Also, the involvement of plating, curing and solder reflowing processes requires the material constituting the multilayer printed board to have superior properties, including solvent resistance, water resistance, heat resistance and high-temperature dimensional stability. More specifically, the following are strongly demanded for the material: the material has properties resistant to acids, alkalis and organic solvents; a moisture absorption of the material that tends to affect electrical properties is low; a dimensional difference of the material prior to and subsequent to application of a high-temperature treatment or heating, believed to affect high-precision circuit connection between upper and lower insulating layers, is low; the material has a heat resistance up to 260° C., which is required in the mounting by lead-free soldering; and the material shows the reduced occurrence of copper migration that tends to affect reliability of electrical connections.

For example, a multilayer printed board for IC package obtained by the buildup method is occasionally exposed to high temperature due to heat build-up of the IC while in actual use. Even under such conditions, the printed board needs to maintain high reliability. However, a dimensional change of the resin when exposed to high temperature, if large, causes separation thereof from a metal wiring such as circuit-forming copper to result in the occurrence of problematic short-circuiting or wire breaking.

The similar problem likely occurs even in a thin multilayer flexible printed board which has recently come into widespread use, when an adhesive layer for bonding single-layer flexible printed boards differs largely in linear expansion coefficient from a polyimide resin film constituting the flexible printed board or from a metal wiring such as circuit-forming copper.

The multilayer printed board made according to the method disclosed in the above-specified Patent Literature 1 has imparted thereto improved high-temperature properties as a result of the combined use of an epoxy resin having superior heat resistance and an inorganic filler. However, a property improving effect is hardly observed at temperatures above a glass transition temperature of a cured product of the epoxy resin. Even below the glass transition temperature of the cured product of epoxy resin, the property improving effect is little. In addition, neither of moisture absorbency and solvent resistance is hardly improved.

Loading of an inorganic filler in a resin has been conventionally known as a measure to reduce a linear expansion coefficient at or below the glass transition temperature of a cured product of the resin, as described in the above-identified Patent Literature 1. However, if the difference in linear expansion coefficient between the resin layer and the metal wiring is to be reduced, the inorganic filler must be loaded in a large amount. Also, even if a large amount of the inorganic filler is loaded, it is still difficult to sufficiently reduce a linear expansion coefficient when the printed board is exposed to a temperature above the glass transition temperature of the cured product of resin, e.g., when subjected to solder reflowing or other high-temperature treatments. Also, recent attention to environment has led to the use of a lead-free solder that encourages practice of a solder reflowing process at higher temperatures. Hence, the mere use of a highly heat-resistant resin results in the frequent occurrence of inconveniences during a high-temperature treatment such as solder reflowing, if a linear expansion coefficient is high at a temperature above the glass transition temperature of the cured product of resin.

As described earlier, it is required that a resin for use as an insulating substrate in a multilayer printed board should be hardly influential in electrical properties, that is, have low dielectric constant and dielectric loss tangent and show superior dielectric properties. It is also required that such a resin should undergo little dimensional change when it is subjected to a high-temperature treatment such as solder reflowing or when in an actual use, that is, should exhibit a low thermal expansion coefficient.

In view of the above-described problems and the current state of the art, the present invention is directed to provide a thermosetting resin composition that can be formed into a shaped structure, such as a resin sheet, which not only exhibits superior dielectric properties and dimensional stability at high temperature but also shows little dimensional change when subjected to a thermal history in a high temperature range, i.e., exhibits a low linear expansion coefficient, and also provide a resin sheet and a resin sheet for insulating substrate both using the thermosetting resin composition.

The thermosetting resin composition of the present invention is characterized as containing an epoxy resin having an epoxy equivalent weight of 100-2,000, an epoxy hardener comprised of a compound having a phenol group, and a layered silicate in the amount of 0.2-100 parts by weight, based on 100 parts by weight of resin constituents including the epoxy resin and epoxy hardener.

In a particular aspect of the thermosetting resin composition in accordance with the present invention, the epoxy resin contains at least one type selected from the group consisting of a bisphenol A epoxy resin, biphenyl epoxy resin, dicyclopentadiene epoxy resin and naphthalene epoxy resin.

In another particular aspect of the thermosetting resin composition in accordance with the present invention, the epoxy hardener comprises at least one type selected from the group consisting of hydrophobic phenol compounds represented by the following formulas (1)-(3).

[Chemical 1]

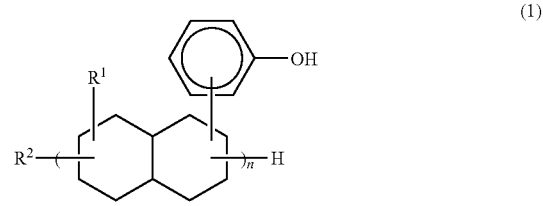

In the above formula (1), $R^1$ denotes methyl or ethyl, $R^2$ denotes hydrogen or a hydrocarbon group and n indicates an integer of 2-4.

[Chemical 2]

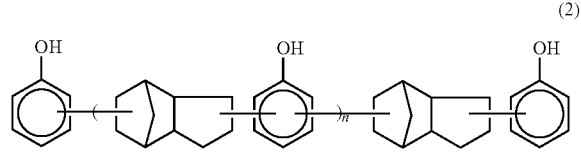

In the above formula (2), n indicates Q or an integer of 1-5.

[Chemical 3]

$$R^3\text{--}(CH_2)_p\text{--}R^4\text{--}(CH_2)_q\text{--}R^5)_r\text{--}R^6 \quad (3)$$

In the above formula (3), $R^3$ denotes a group represented by the following formula (4a) or (4b), $R^4$ denotes a group represented by the following formula (5a), (5b) or (5c), $R^5$ denotes a group represented by the following formula (6a) or (6b), $R^6$ denotes hydrogen or a molecular chain group containing 1-20 carbon atoms, p and q independently indicate an integer of 1-6, and r indicates an integer of 1-11.

[Chemical 4]

[Chemical 5]

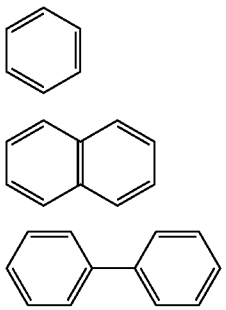

(5a)

(5b)

(5c)

[Chemical 6]

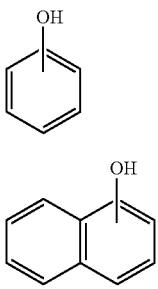

(6a)

(6b)

In a further particular aspect of the thermosetting resin composition in accordance with the present invention, the layered silicate is at least one selected from the group consisting of montmorillonite, hectorite, swelling mica and vermiculite.

In a further particular aspect of the thermosetting resin composition in accordance with the present invention, the layered silicate contains at least one ammonium salt selected from the group consisting of alkyl ammonium salts containing 6 or more carbon atoms, aromatic quaternary ammonium salts and heterocyclic quaternary ammonium salts.

The resin sheet in accordance with the present invention comprises the thermosetting resin composition according to the present invention.

In another particular aspect of the resin sheet of the present invention, the resin sheet comprises a cured product of the aforementioned resin sheet.

In a further particular aspect of the resin sheet in accordance with the present invention, a part or all of the layered silicate is dispersed in the form of a stack consisting of 5 or less layers and has a mean interlayer spacing of at least 3 nm along the (001) plane when measured by a wide-angle X-ray diffraction method.

In a further particular aspect of the resin sheet in accordance with the present invention, the resin sheet exhibits a mean linear expansion coefficient ($\alpha 1$) of not exceeding $4.0 \times 10^{-5}$/° C. over a temperature range that is 10-50° C. lower than a glass transition temperature of a cured product of the thermosetting resin composition.

In a further particular aspect of the resin sheet in accordance with the present invention, the resin sheet exhibits a mean linear expansion coefficient ($\alpha 2$) of not exceeding $4.0 \times 10^{-5}$/° C. over a temperature range that is 10-50° C. higher than the glass transition temperature of the cured product of the thermosetting resin composition.

In a further particular aspect of the resin sheet in accordance with the present invention, the cured product of thermosetting resin composition exhibits a dielectric constant at 1 GHz of not exceeding 3.3 and a dielectric loss tangent at 1 GHz of not exceeding 0.015.

The resin sheet for insulating substrate in accordance with the present invention comprises the resin sheet according to the present invention.

The thermosetting resin composition of the present invention contains an epoxy resin having an epoxy equivalent weight of 100-2,000, an epoxy hardener comprised of a compound having a phenol group, and a layered silicate. The layered silicate is contained in the range of 0.2-100 parts by weight, based on 100 parts by weight of resin constituents including the epoxy resin and epoxy hardener.

Because of inclusion of the aforementioned components and a proper amount of the layered silicate, the thermosetting resin composition of the present invention can be processed into a shaped structure, such as a resin sheet, which shows superior dielectric properties and good dimensional stability at high temperature. Further, the shaped structure undergoes little dimensional change even when it is subjected to a thermal history in a high temperature range.

In the case where the epoxy resin contains at least one selected from the group consisting of a bisphenol A epoxy resin, a biphenyl epoxy resin, a dicyclopentadiene epoxy resin and a naphthalene epoxy resin, the strength and dimensional stability at high temperature of the material is improved due to the rigid molecular chains. Due also to the close packing of molecules, the material shows superior electrical properties such as in dielectric loss tangent.

In the case where the epoxy hardener comprises at least one selected from the group consisting of hydrophobic phenol compounds represented by the preceding formulas (1)-(3), a cured product of the thermosetting resin composition or the resin sheet shows the improved heat resistance and dimensional stability and the reduced moisture absorbance. Also, they are low not only in dielectric constant but also in dielectric loss tangent and are superior in dielectric property.

If the layered silicate is at least one selected from the group consisting of montmorillonite, hectorite, swelling mica and vermiculite, its dispersion in the resin is improved to thereby increase an interfacial area between the resin and the layered silicate. A resin constraining effect is thus enhanced to improve strength and dimensional stability at high temperature of the resin.

If the layered silicate contains at least one ammonium salt selected from the group consisting of alkyl ammonium salts containing 6 or more carbon atoms, aromatic quaternary ammonium salts and heterocyclic quaternary ammonium salts, the spaces between crystal layers of the layered silicate can be hydrophobicized sufficiently.

The resin sheet comprised of the thermosetting resin composition in accordance with the present invention shows superior dielectric characteristics and dimensional stability at high temperature. Even when subjected to a thermal history in a high temperature range, the resin sheet undergoes little dimensional change prior to and subsequent to application of the thermal history, i.e., shows a low thermal linear expansion coefficient. Also, thickness reduction of the resin sheet can be achieved.

The resin sheet comprising a cured product of the aforementioned resin sheet, even if subjected to a thermal history, shows a further less dimensional change prior to and subsequent to application of the thermal history.

If a part of all of the layered silicate is dispersed in the form of a stack consisting of 5 or less layers and has a mean interlayer spacing of at least 3 nm along the (001) plane when measured by a wide-angle X-ray diffraction method, the respective interfacial areas between the epoxy resin and the layered silicate and between the epoxy hardener and the layered silicate can be increased sufficiently. In addition, sheet crystals of the layered silicate can be properly spaced from each other. As a result, a cured product of resin sheet has imparted thereto further improved high-temperature physical properties, mechanical properties, heat resistance and dimensional stability.

If a mean linear expansion coefficient ($\alpha 1$) of the resin sheet does not exceed $4.0 \times 10^{-5}/°C$. over a temperature range that is 10-50° C. lower than a glass transition temperature of a cured product of the thermosetting resin composition, the resin sheet exhibits good dimensional stability before it is subjected to a thermal history.

If a mean linear expansion coefficient ($\alpha 2$) of the resin sheet does not exceed $4.0 \times 10^{-5}/°C$. over a temperature range that is 10-50° C. higher than a glass transition temperature of a cured product of the thermosetting resin composition, the resin sheet exhibits good dimensional stability after it is subjected to a thermal history.

If the cured product of the thermosetting resin composition has a dielectric constant at 1 GHz of not exceeding 3.3 and a dielectric loss tangent at 1 GHz of not exceeding 0.015, the resin sheet exhibits superior electrical properties.

The resin sheet for insulating substrate, if it is comprised of the resin sheet according to the present invention, exhibits superior dielectric properties and good dimensional stability at high temperature. Also, it undergoes little dimensional change even when subjected to a thermal history in a high temperature range, i.e., exhibits a low thermal linear expansion coefficient. Further, thickness reduction of the resin sheet can be achieved.

BEST MODE FOR CARRYING OUT THE INVENTION

The present invention is below described in detail.

The thermosetting resin composition of the present invention contains an epoxy resin having an epoxy equivalent weight of 100-2,000, an epoxy hardener in the form of a compound having a phenol group, and a layered silicate. The layered silicate is dispersed in a matrix comprised of the aforesaid epoxy resin and epoxy hardener.

The epoxy resin for use in the thermosetting resin composition of the present invention needs to have an epoxy equivalent weight of 100-2,000. If the epoxy equivalent weight of the epoxy resin falls below 100, a distance between crosslink points of the epoxy resin is shortened. Then, the thermosetting resin composition, or a resin sheet or other shaped structure of the thermosetting resin composition, when cured, becomes brittle. As a result, sufficient toughness or other physical properties may not be attained. On the other hand, if the epoxy equivalent weight of the epoxy resin goes beyond 2,000, a distance between crosslink points of the epoxy resin becomes long. Then, the thermosetting resin composition or a shaped structure thereof, when cured, becomes soft and fails to achieve sufficient reduction of its linear expansion coefficient.

The epoxy resin used is not particularly specified, so long as it has an epoxy equivalent weight of 100-2,000. Examples of epoxy resins include bisphenol epoxy resins such as bisphenol A epoxy resins, bisphenol F epoxy resins, bisphenol AD epoxy resins and bisphenol S epoxy resins; novolak epoxy resins such as phenol novolak epoxy resins and cresol novolak epoxy resins; aromatic epoxy resins such as naphthalene epoxy resins, biphenyl epoxy resins, dicyclopentadiene epoxy resins and triphenolmethane triglycidyl ether; aliphatic epoxy resins; alicyclic epoxy resins; and hydrides and bromides or other halides of these resins. The use of bisphenol epoxy resins, naphthalene epoxy resins, dicyclopentadiene epoxy resins and biphenyl epoxy resins, among them, is preferred for their rigid molecular chains that improve material's strength and dimensional stability at high temperature and for their close molecular packing that enables the material to exhibit good electrical characteristics. These epoxy resins may be used alone or in combination.

The compound having a phenol group is not particularly specified, so long as it has a phenol structure. Examples of compounds having a phenol group include hydrophobic phenol compounds represented by the above formulas (1)-(3), phenol novolaks, o-cresol novolaks, p-cresol novolaks, t-butylphenol novolaks, dicyclopentadiene cresols and their derivatives. Among them, the hydrophobic phenol compounds represented by the above formulas (1)-(3) are preferably used. With the use thereof, the thermosetting resin composition or the resin sheet comprised thereof, when cured, not only exhibits superior heat resistance and dimensional stability and lower moisture absorbance, but also exhibits superior dielectric properties such as lower dielectric constant and dielectric loss tangent. These compounds having a phenol group may be used alone or in combination.

In the preceding formula (3), $R^6$ represents hydrogen or a molecular chain group containing 1-20 carbon atoms. Examples of molecular chain groups containing 1-20 carbon atoms include alkyls such as methyl, ethyl and propyl; and molecular chain groups having an alicyclic hydrocarbon such as benzene, naphthalene or cyclopentadiene.

The blending proportion of the epoxy resin having an epoxy equivalent weight of 100-2,000 and the epoxy hardener in the form of a phenol-containing compound is not particularly specified. The equivalent ratio of the epoxy reactive groups in the epoxy hardener to the epoxy groups in the epoxy resin is preferably 0.1-5.0, more preferably 0.5-2.0. If the equivalent ratio falls outside the 0.1-5.0 range, the thermosetting resin composition or the shaped structure comprised thereof, when cured, may exhibit insufficient heat resistance or poor insulation properties. In the case where the thermosetting resin composition of the present invention contains an epoxy-containing compound other than the above-listed epoxy resins or an epoxy hardener other than the above-listed epoxy hardeners, its epoxy or epoxy reactive equivalent weight may also be taken into consideration to keep the above equivalent ratio within the specified range.

In the thermosetting resin composition of the present invention, the aforementioned epoxy hardener in the form of a compound having a phenol group may be used in combination with any other conventionally-known epoxy hardener.

Examples of such other epoxy hardeners include, but not particularly limited to, amine compounds, polyaminoamides and other compounds synthesized from amine compounds, tertiary amine compounds, imidazole compounds, hydrazide compounds, melamine compounds, acid anhydrides, thermally latent cationic polymerization catalysts, photolatent cationic polymerization catalysts, dicyandiamide and their derivatives. These other epoxy hardeners may be used alone or in combination.

Examples of amine compounds include, but not limited to, linear aliphatic amines and their derivatives such as ethylenediamine, diethylenetriamine, triethylenetetramine, tetraethylenepentamine, polyoxypropylenediamine and polyoxypropylenetriamine; cyclic aliphatic amines and their derivatives such as menthanediamine, isophoronediamine, bis(4-amino-3-methylcyclohexyl)methane, diaminodicyclo-hexyl-methane, bis(aminomethyl)cyclohexane, N-aminoethyl-piperazine and 3,9-bis(3-aminopropyl)-2,4,8,10-tetraoxa-spiro (5,5)undecane; aromatic amines and their derivatives such as m-xylenediamine, α-(m/p-aminophenyl)ethylamine, m-phenylenediamine, diaminodiphenylmethane, diaminodiphenylsulfone, α,α-bis(4-aminophenyl)-p-diisopropylbenzene; and the like.

Examples of compounds synthesized from amine compounds include, but not particularly limited to, polyamino amide compounds synthesized from the above-listed amine compounds and carboxylic acid compounds such as succinic acid, adipic acid, azelaic acid, sebacic acid, dodecanoic acid, isophthalic acid, terephthalic acid, dihydroisophthalic acid, tetrahydro-isophthalic acid and hexahydroisophthalic acid, and their derivatives; polyaminoimide compounds synthesized from the above-listed amine compounds and maleimide compounds such as diaminodiphenylmethanebismaleimide, and their derivatives; ketimine compounds synthesized from the above-listed amine compounds and ketone compounds, and their derivatives; polyamino compounds synthesized from the above-listed amine compounds and other compounds such as epoxy compounds, urea, thiourea, aldehyde compounds, phenol compounds and acrylic compounds, and their derivatives; and the like.

Examples of tertiary amine compounds include, but not limited to, N,N-dimethylpiperazine, pyridine, picoline, benzyldimethyl amine, 2-(dimethylaminomethyl)phenol, 2,4,6-tris(dimethylaminomethyl)phenol, 1,8-diazobiscyclo(5,4,0) undecene-1 and their derivatives.

Examples of imidazole compounds include, but not limited to, 2-methylimidazole, 2-ethyl-4-methylimidazole, 2-undecylimidazole, 2-heptadecylimidazole, 2-phenylimidazole and their derivatives.

Examples of hydrazide compounds include, but not particularly limited to, 1,3-bis(hydrazinocarboethyl)-5-isopropylhydantoin, 7,11-octadecadiene-1,18-dicarbo-hydrazide, eicosanoic diacid dihydrazide, adipic acid dihydrazide and their derivatives.

Examples of melamine compounds include, but not limited to, 2,4-diamino-6-vinyl-1,3,5-triazine and its derivatives.

Examples of acid anhydrides include, but not limited to, phthalic anhydride, trimellitic anhydride, pyromellitic anhydride, benzophenonetetracarboxylic anhydride, ethylene glycol bis(anhydro) trimellitate, glycerol tris(anhydro) trimellitate, methyltetrahydrophthalic anhydride, tetrahydrophthalic anhydride, nadic anhydride, methylnadic anhydride, trialkyltetrahydrophthalic anhydride, hexahydrophthalic anhydride, methylhexahydrophthalic anhydride, 5-(2,5-dioxotetrahydrofuryl)-3-methyl-3-cyclohexene-1,2-dicarboxylic anhydride, trialkyltetrahydrophthalic anhydride-maleic anhydride adduct, dodecenylsuccinic anhydride, polyazelaic anhydride, polydodecanoic dianhydride, chlorendic anhydride and their derivatives.

Examples of thermally latent cationic polymerization catalysts include, but not particularly limited to, ionic thermally latent cationic polymerization catalysts such as benzylsulfonium salt, benzylammonium salt, benzylpyridinium salt and benzyl-phosphonium salt which are associated with counter anions such as antimony hexafluoride, phosphorus hexafluoride and boron tetrafluoride; nonionic thermally latent cationic polymerization catalysts such as N-benzylphthalimide and aromatic sulfonate ester; and the like.

Examples of photolatent cationic polymerization catalysts include, but not particularly limited to, ionic photolatent cationic polymerization catalysts such as aromatic diazonium salts, aromatic halonium salts, aromatic sulfonium salts and other onium salts which are associated with counter anions such as antimony hexafluoride, phosphorus hexafluoride and boron tetrafluoride, and organometallic complexes such as iron-allene complex, titanocene complex and arylsilanol-aluminum complex; and nonionic photolatent cationic polymerization catalysts such as nitrobenzyl esters, sulfonic acid derivatives, phosphate esters, phenolsulfonate esters, diazonaphthoquinone and N-hydroxyimidesulfonate.

The layered silicate for use in the thermosetting resin composition of the present invention refers to a layered silicate compound, either synthetic or natural, which has exchangeable metal cations between crystal layers.

Examples of layered silicates include, but not limited to, smectite clay minerals such as montmorillonite, hectorite, saponite, beidellite, stevensite and nontronite; swelling mica; vermiculite; and halloysite. The use of at least one type of layered silicate selected from the group consisting of montmorillonite, hectorite, swelling mica and vermiculite is preferred for their high dispersibility in a resin and their ability to improve resin strength and dimensional stability at high temperature. These layered silicates may be used alone or in combination.

Although not intended to be limiting, the layered silicate preferably has a mean length of not exceeding 2 μm, more preferably not exceeding 1 μm, further preferably not exceeding 0.5 μm. If the mean length of the layered silicate does not exceed 2 μm, a transparency of the thermosetting resin composition or shaped structure thereof increases to facilitate alignment thereof with an underlying substrate or member during an operation. If the mean length of the layered silicate does not exceed 1 μm, the thermosetting resin composition or shaped structure thereof, when machined by a laser, leaves less residues. Accordingly, their laser machinability is improved. Further, if the mean length of the layered silicate does not exceed 0.5 μm, the thermosetting resin composition or shaped structure thereof can also be used as a material for optical waveguides and other optical devices.

The crystal shape of the layered silicate is not particularly specified. Preferably, the layered silicate has a mean length of at least 0.01 μm, a thickness of 0.001-1 μm and an aspect ratio of 20-500. More preferably, the layered silicate has a mean length of at least 0.05 μm, a thickness of 0.01-0.5 μm and an aspect ratio of 50-200.

The layered silicate preferably shows a large value for shape anisotropy defined by the following equation. With the use of layered silicate having a large shape anisotropy, the thermosetting resin composition or shaped structure thereof exhibits improved mechanical strength and other physical properties.

Shape anisotropy=area of a surface of a flaky crystal that extends along a plane of lamination/area of a surface of the flaky crystal that extends across the plane of lamination The exchangeable metal cations present between crystal layers of the layered silicate refer to metal ions, such as sodium and calcium ions, which reside on surfaces of flaky crystals of the layered silicate. These metal ions are cation exchangeable with other cationic materials, so that various other cationic materials can be inserted (intercalated) or trapped between crystal layers of the layered silicate.

A cation exchange capacity of the layered silicate is not particularly specified. However, it may preferably be 50-200 milliequivalents/100 g. If the cation exchange capacity of the layered silicate is below 50 milliequivalents/100 g, the amount of cationic materials inserted or trapped, through cation exchange, between crystal layers of the layered silicate may be reduced to result in the failure to fully hydrophobicize (nonpolarize) spaces between crystal layers. On the other hand, if the cation exchange capacity of the layered silicate exceeds 200 milliequivalents/100 g, a binding force between crystal layers thereof may become excessively strong to increase the difficulty of the crystal flakes to separate from each other.

The layered silicate is preferably subjected to a chemical treatment that improves dispersion of the layered silicate in the epoxy resin and epoxy hardener. The layered silicate which shows improved dispersibility in the epoxy resin and epoxy as a result of such a chemical treatment is hereinafter referred to as "organically modified layered silicate".

While not intended to be limiting, the aforementioned chemical treatment can be carried out, for example, by the following chemical modification methods (1)-(6). These chemical modification methods may be employed alone or in combination.

The chemical modification method (1) is also referred to as a cation exchange method using a cationic surfactant. Specifically, when the thermosetting resin composition of the present invention is obtained using an epoxy resin having a relatively low polarity, the layered silicate is previously cation exchanged at its interlayer spaces with a cationic surfactant so that they are hydrophobicized. The previous hydrophobicization of interlayer spaces of the layered silicate increases an affinity of the layered silicate for the epoxy resin and epoxy hardener, so that the layered silicate can be more uniformly and finely dispersed in the epoxy resin and epoxy hardener.

The cationic surfactant is not particularly specified. Examples of cationic surfactants include quaternary ammonium salts and quaternary phosphonium salts. The use of at least one ammonium salt selected from the group consisting of alkyl ammonium salts containing 6 or more carbon atoms, aromatic quaternary ammonium salts and heterocyclic quaternary ammonium salts, among them, is preferred for their ability to fully hydrophobicize spaces between crystal layers of the layered silicate. These cationic surfactants may be used alone or in combination.

The quaternary ammonium salt is not particularly specified in type. Examples of useful quaternary ammonium salts include alkyl ammonium salts such as trimethylalkyl ammonium salts, triethylalkyl ammonium salts, tributylalkyl ammonium salts, dimethyldialkyl ammonium salts, dibutyldialkyl ammonium salts, methylbenzyldialkyl ammonium salts, dibenzyldialkyl ammonium salts, trialkylmethyl ammonium salts, trialkylethyl ammonium salts and trialkylbutyl ammonium salts; quaternary ammonium salts having an aromatic ring (aromatic quaternary ammonium salts) such as benzylmethyl{2-[2-(p-1,1,3,3-tetramethylbutylphenooxy) ethoxy]ethyl}ammonium chloride; aromatic amine-derived quaternary ammonium salts (aromatic quaternary ammonium salts) such as trimethylphenyl ammonium; quaternary ammonium salts having a heterocyclic ring (heterocyclic quaternary ammonium salts) such as alkyl pyridinium salts and imidazolium salts; dialkyl quaternary ammonium salts having two polyethylene glycol chains; dialkyl quaternary ammonium salts having two polypropylene glycol chains; trialkyl quaternary ammonium salts having a polyethylene glycol chain; trialkyl quaternary ammonium salts having a polypropylene glycol chain; and the like. Among them, lauryltrimethyl ammonium salt, stearyltrimethyl ammonium salt, trioctylmethyl ammonium salt, distearyldimethyl ammonium salt, di-hardened tallow-dimethyl ammonium salt, distearyl-dibenzyl ammonium salt and N-polyoxyethylene-N-lauryl-N,N'-dimethyl ammonium salt are preferably used. These quaternary ammonium salts may be used alone or in combination.

The quaternary phosphonium salt is not particularly specified in type. Examples of quaternary phosphonium salts include dodecyltriphenyl phosphonium salt, methyltriphenyl phosphonium salt, lauryltrimethyl phosphonium salt, stearyl trimethyl phosphonium salt, trioctylmethyl phosphonium salt, distearyldimethyl phosphonium salt and distearyldibenzyl phosphonium salt. These quaternary phosphonium salts may be used alone or in combination.

The chemical modification method (2) utilizes a compound having, at its molecular terminal, at least one functional group either chemically linkable to a hydroxyl group or having a high chemical affinity for a hydroxyl group to chemically treat hydroxyl groups present on crystal surfaces of the organically modified layered silicate obtained via chemical treatment by the chemical modification method (1).

The chemical modification method (3) utilizes a compound having at least one functional group either chemically linkable to a hydroxyl group or having a high chemical affinity for a hydroxyl group at its one terminal end and at least one reactive functional group at its another terminal end to chemically treat hydroxyl groups present on crystal surfaces of the organically modified layered silicate obtained via chemical treatment by the chemical modification method (1).

Examples of functional groups either chemically linkable to a hydroxyl group or having a high chemical affinity for a hydroxyl group include, but not particularly limited to, alkoxy, epoxy (glycidyl), carboxyl (inclusive of dibasic anhydride), hydroxyl, isocyanate, aldehyde and amine groups.

Examples of compounds having a functional group either chemically linkable to a hydroxyl group or having a high chemical affinity for a hydroxyl group include, but not limited to, silane compounds, titanate compounds, epoxy compounds, carboxylic acids, sulfonic acids and alcohols, which have the above-illustrated functional group or the like, respectively. The use of silane compounds, among them, is preferred. These compounds may be used alone or in combination.

Examples of silane compounds useful in the chemical modification method (2) include, but not limited to, methyltriethoxysilane, dimethyldimethoxysilane, trimethyl-methoxysilane, hexyltrimethoxysilane, hexyltriethoxysilane, octadecyltrimethoxysilane and octadecyltriethoxysilane. These silane compounds useful in the chemical modification method (2) may be used alone or in combination.

Examples of silane compounds useful in the chemical modification method (3) include, but not limited to, vinyltrimethoxysilane, vinyltriethoxysilane, vinyltris(β-methoxyethoxy)silane, γ-aminopropyltrimethoxysilane, γ-aminopropylmethyldimethoxysilane, γ-aminopropyldimethylmethoxysilane, γ-aminopropyltriethoxysilane, γ-aminopropylmethyldiethoxysilane, γ-aminopropylmethylethoxysilane, N-β-(aminoethyl)γ-aminopropyltrimethoxysilane, N-β-(amino-ethyl)γaminopropyltriethoxysilane, N-β-(aminoethyl)γ-aminopropylmethyldimethoxysilane, γ-methacryloxypropylmethyldimethoxysilane, γ-methacryloxypropylmethyldiethoxy-silane, γ-methacryloxypropyltrimethoxysilane and γ-methacryloxypropyltriethoxysialne. These silane compounds useful in the chemical modification method (3) may be used alone or in combination.

The chemical modification method (4) utilizes a compound having an anionic surface activity to chemically treat crystal surfaces of the organically modified layered silicate obtained via chemical treatment by the chemical modification method (1).

The compound having an anionic surface activity is not particularly specified in type, so long as it can chemically treat the layered silicate by ionic interaction. Examples of compounds having an anionic surface activity include sodium laurate, sodium stearate, sodium oleate, sulfate ester salts of higher alcohols, sulfate ester salts of secondary higher alcohols and sulfate ester salts of unsaturated alcohols. These compounds having an anionic surface activity may be used alone or in combination.

The chemical modification method (5) utilizes any of the aforementioned compounds having an anionic surface activity which contains at least one reactive functional group at a site other than the anionic site in the molecular chain to achieve the chemical treatment.

The chemical modification method (6) further utilizes a resin having a functional group reactive with a layered silicate, such as a maleic anhydride modified polyphenylene ether resin, to chemically treat the organically modified layered silicate obtained via chemical treatment by any of the chemical modification methods (1)-(5).

For the thermosetting resin composition of the present invention, the use of hectorite chemically treated with a trioctylmethylammonium salt, among the preceding organically modified layered silicates, is particularly preferred for its high affinity for the epoxy resin and epoxy hardener and its high physical property improving effect on a cured product of the thermosetting resin composition.

Various methods can be utilized to disperse the layered silicate in the epoxy resin and epoxy hardener. For example, the aforementioned orgacinally modified layered silicate or a dispersing agent may be used. Alternatively, a dispersion of the layered silicate in a solvent may be mixed with the epoxy resin and epoxy hardener. By using these dispersing methods, the layered silicate can be uniformly and finely dispersed in the epoxy resin and epoxy hardener.

In the thermosetting resin composition of the present invention, the layered silicate (hereinafter also inclusive of the organically modified layered silicate) is contained in the range of 0.2-100 parts by weight, based on 100 parts by weight of resin constituents including the epoxy resin having an epoxy equivalent weight of 100-2,000 and the epoxy hardener in the form of a compound having a phenol group. The amount of the layered silicate incorporated is preferably in the range of 5-100 parts by weight, more preferably in the range of 10-80 parts by weight.

If the amount of the layered silicate incorporated is below 0.2 parts by weight, based on 100 parts by weight of resin constituents including the epoxy resin and epoxy hardener, a high-temperature physical property improving effect and a moisture absorbance reducing effect may not be obtained sufficiently. On the other hand, if the amount of the layered silicate incorporated exceeds 100 parts by weight, based on 100 parts by weight of resin constituents including the epoxy resin and epoxy hardener, the thermosetting resin composition may increase in density excessively. This, as a result, lowers mechanical properties and impairs practical use.

If the amount of the layered silicate incorporated is below 5 parts by weight, based on 100 parts by weight of resin constituents including the epoxy resin and epoxy hardener, it may become difficult to reduce a linear expansion coefficient of a cured product of the thermosetting resin composition or shaped structure thereof at temperatures higher than its glass transition temperature, while possible to reduce it to some degree at temperatures lower than the glass transition temperature. On the other hand, if the amount of the layered silicate incorporated exceeds 100 parts by weight, based on 100 parts by weight of resin constituents including the epoxy resin and epoxy hardener, the processability of the thermosetting resin composition may become insufficient. The flexibility or extensibility of a cured product thereof may also become insufficient.

If the amount of the layered silicate incorporated is kept within the range of 10-80 parts by weight, based on 100 parts by weight of resin constituents including the epoxy resin and epoxy hardener, the thermosetting resin composition, particularly a cured product thereof, exhibits superior dimensional stability, heat resistance and dielectric properties, while maintaining its physical properties and process suitability.

The high loading of inorganic filler in a thermosetting resin composition generally makes it difficult to sufficiently reduce a linear expansion coefficient of a cured product thereof at a temperature higher than its glass transition temperature. It also makes it difficult to reduce a thickness of an insulating layer and thus impairs transparency of the insulating layer. Accordingly, it causes inconveniences in an alignment process of insulating layers during laser processing. However, the layered silicate in the thermosetting resin composition of the present invention is fine in size and highly dispersible, and accordingly hardly causes the above-described problems even if it is highly loaded. In combination of the epoxy resin, epoxy hardener and layered silicate that together constitute the thermosetting resin composition of the present invention, the respective interfacial areas between the layered silicate and the epoxy resin and between the layered silicate and the epoxy hardener are so large that the layered silicate interacts strongly with the epoxy resin and epoxy hardener. Thus, the layered silicate provides a much higher physical property improving effect, compared to the other inorganic filler in the same amount. Therefore, the use of the layered silicate also enables the loading thereof to be made lower than that of the other inorganic filler without loss of mechanical properties.

The thermosetting resin composition of the present invention contains the epoxy resin, epoxy hardener and layered silicate as its essential components. If necessary, it may further contain a resin copolymerizable with the epoxy resin, for example.

Examples of such copolymerizable resins include, but not limited to, epoxy resins other than the aforesaid epoxy resin having an epoxy equivalent weight of 100-2,000, phenoxy resins, thermosetting modified polyphenylene ether resins and benzoxazine resins. These copolymerizable resins may be used alone or in combination.

The aforementioned other epoxy resin refers to an organic compound having at least one epoxy group per molecule. This other epoxy resin preferably contains one or more epoxy groups per molecule, more preferably two or more epoxy groups per molecule. Here, the number of epoxy groups per molecule is calculated by dividing a total number of epoxy groups present in the epoxy resin by a total number of molecules in the epoxy resin.

Any epoxy resin other than the epoxy resin having an epoxy equivalent weight of 100-2,000 can be used as the other epoxy resin. Such other epoxy resins are conventionally known in the art. These other epoxy resins may be used alone or in combination.

Examples of thermosetting, modified polyphenylene ether resins include, but not limited to, resins made via modification of a polyphenylene ether resin with thermosetting functional groups such as epoxy, isocyanate and amino groups.

These thermosetting, modified polyphenylene ether resins may be used alone or in combination.

The aforementioned benzoxazine resin refers to a benzoxazine monomer capable of polymerization via ring-opening of its oxazine ring, as well as a resin obtained via ring-opening polymerization of oxazine rings in benzoxazine monomers. Examples of benzoxazine monomers include, but not limited to, those having a substituent group, such as phenyl, methyl or cyclohexyl, attached either to a nitrogen of an oxazine ring or between nitrogens of two oxazine rings. These benzoxazine monomers and bezoxazine resins may be used alone or in combination.

Preferably, the thermosetting resin composition when formed into a shaped structure has a dispersed layer of an engineering plastic effective to improve extensibility and prevent brittleness of the thermosetting resin composition.

The engineering plastic for use in the thermosetting resin composition refers to a high-performance plastic that lends itself to use for industrial (engineering) purposes. Engineering plastics generally have advantages such as high strength and heat-resistant temperature and superior chemical resistance.

The thermosetting resin composition containing an engineering plastic increases its resistance to brittleness and exhibits improved electrical properties as the layered silicate is dispersed. Also, the inclusion of the engineering plastic raises a melting point of the thermosetting resin composition to thereby suppress reduction in linear expansion coefficient thereof.

The presence of the engineering plastic as a dispersing phase in a shaped structure comprised of the thermosetting resin composition enables the shaped structure, both before and after cured, to exhibit improved electrical characteristics while maintaining sufficient mechanical properties. Dispersion of the engineering plastic is carried out by a method wherein a solvent type and mixing method are suitably chosen.

The engineering plastic is preferably finely dispersed when the thermosetting resin composition is formed into a shaped structure. More preferably, the engineering plastic is evenly dispersed to sizes of not exceeding 3 µm. If the engineering plastic is finely dispersed, the shaped structure comprised of the thermosetting resin composition, both before and after being cured, exhibits improved electrical characteristics and enhanced resin strength, extensibility and fracture toughness.

Examples of engineering plastics include, but not limited to, polysulfone resins, polyether sulfone resins, polyimide resins, polyether imide resins, polyamide resins, polyacetal resins, polycarbonate resins, polyethylene terephthalate resins, polybutylene terephthalate resins, aromatic polyester resins, modified polyphenylene oxide resins, polyphenylene sulfide resins and polyether ketone resins. The use of at least one engineering plastic selected from the group consisting of polysulfone resins, polyether sulfone resins, polyimide resins and polyether imide resins, among them, is preferred for their compatibility with the epoxy resin and their own properties. These engineering plastics may be used alone or in combination.

If necessary, the thermosetting resin composition of the present invention may further contain a thermoplastic elastomer (thermoplastic rubber), a crosslinked rubber or a thermoplastic resin such as a polyvinyl acetal resin, for example.

Examples of thermoplastic elastomers include, but not limited to, styrenic elastomers, olefinic elastomers, urethane elastomers and polyester elastomers. These thermoplastic elastomers may be modified with a functional group such as epoxy (glycidyl), isocyanate or amino to increase their compatibility with the epoxy resin. These thermoplastic elastomers may be used alone or in combination.

Examples of crosslinked rubbers include, but not limited to, crosslinked products such as of isoprene rubber, butadiene rubber, 1,2-polybutadiene, styrene-butadiene copolymer rubber, nitrile rubber, butyl rubber, chloroprene rubber, ethylene-propylene copolymer rubber, silicone rubber and urethane rubber. These crosslinked rubbers may be modified with a functional group such as epoxy, isocyanate or amino to increase their compatibility with the epoxy resin. Examples are crosslinked products of epoxy modified butadiene rubber and epoxy modified nitrile rubber. These crosslinked rubbers may be used alone or in combination.

When necessary, the thermoplastic resin composition of the present invention may further contain one or more of the following additives: fillers other than layered silicates, softeners (plasticizers), nucleation agents, antioxidants (age resisters), thermal stabilizers, light stabilizers, UV absorbers, lubricants, flame retardants, antistatic agents, antifogging agents, coloring agents and organic solvents.

The thermosetting resin composition of the present invention can be produced by various methods, including direct kneading, solution mixing and masterbatch methods. According to the direct kneading method, predetermined amounts of the epoxy resin, epoxy hardener and layered silicate, which are the essential components, and one or more other optional components are directly blended and kneaded under normal temperature or under heat conditions. According to the solution mixing method, predetermined amounts of the essential components and other optional components are mixed in a solvent which is subsequently removed. According to the masterbatch method, an excess amount of the layered silicate is first blended with the epoxy resin, epoxy hardener or other resin to prepare a masterbatch. Then, the masterbatch in the determined amount, the epoxy resin, epoxy hardener and other resin in their respective amounts that complement to their predetermined amounts, and other one or more optional components in the predetermined amounts are directly mixed and kneaded under normal temperature or under heat conditions, or alternatively, mixed in a solvent which is subsequently removed.

In the masterbatch method, the masterbatch prepared by loading the layered silicate in the epoxy resin, epoxy hardener or other resin may have the same or different composition as a master batch diluting resin composition which contains the epoxy resin, epoxy hardener or other resin and which is used to dilute the masterbatch such that the layered silicate is brought to a desired concentration.

In the production method of the thermosetting resin composition of the present invention, any method which can knead the formulation components may be utilized. For example, a conventionally known kneader, such as an extruder, two-roll mill or Banbury mixer, may be utilized to uniformly knead the components under normal temperature or heat conditions while applying a shear force. The application of a shear force during kneading in some cases further shortens a mean length of the layered silicate.

The use of the epoxy resin having an epoxy equivalent weight of 100-2,000, the epoxy hardener in the form of a compound having a phenol group and the layered silicate, in combination, increases a glass transition temperature and a heat distortion resistance temperature of the thermosetting resin composition of the present composition, due to restraint of movement of molecular chains. Thus, a shaped structure such as a resin sheet can be obtained which has a low linear expansion coefficient at high temperature and exhibits excellent heat resistance, mechanical and dielectric properties.

Generally, gaseous molecules show a much higher tendency to diffuse in a resin, compared to inorganic fillers such as layered silicates. Since gaseous molecules diffuse in the resin while moving around the layered silicate as the epoxy resin and epoxy hardener diffuse therein, the thermosetting resin composition of the present invention can provide a shaped structure with improved gas barrier properties. Likewise, its barrier properties against substances other than such gaseous molecules can be increased, its solvent resistance improved, and its moisture absorbency and water absorbency lowered. Therefore, a cured product of a resin sheet comprised of the thermosetting resin composition of the present invention can be preferably used as an insulating layer such as of a multilayer printed circuit board. Also, migration of copper from a copper circuit can be prevented. Further, the occurrence of bleedout of additives present in a small amount in the thermosetting resin composition can be prevented which otherwise causes inconveniences such as defective plating.

The thermosetting resin composition of the present invention, even if its layered silicate content is not so high, exhibits improved properties as described above and can thus be rendered into an insulating layer thinner than ones in conventional multilayer printed boards. Accordingly, density increase and thickness reduction of multilayer printed boards can be achieved. Also, the nucleating effect of the layered silicate in crystal formation, as well as the swell-restraining effect attributed to the improved moisture resistance, improve the dimensional stability of a resin sheet comprised of the thermosetting resin composition of the present invention. This reduces a stress engendered due to a difference in dimension of the resin sheet prior to and subsequent to application of a thermal history, and effectively increases reliability of electrical connection when the resin sheet is used as an insulating layer in multilayer printed boards.

Also because the layered silicate when combusted forms a sintered body, the resin sheet retains its shape during combustion. Further, the resin sheet even after combustion is hard to change its shape and retards flame spread. Therefore, the resin sheet exhibits the improved flame retardance.

The thermosetting resin composition of the present invention has various uses. For example, it can be processed, e.g., dissolved in an appropriate solvent or formed into a film (filmed), to provide a varnish, solder resist, resin sheet, prepreg or optical waveguide material.

The resin sheet of the present invention comprises the thermosetting resin composition of the present invention. Also, a resin sheet obtained by curing the resin sheet is another embodiment of the resin sheet of the present invention.

Examples of processing (film-forming) methods for use in the manufacture of the resin sheet of the present invention include, but not particularly limited to, an extrusion method wherein the thermosetting resin composition of the present invention itself or its formulation components are melt kneaded by an extruder and then formed into a film as by a T-die or a circular die; a casting method wherein the thermosetting resin composition of the present invention itself or its formulation components are dissolved or dispersed in an organic or other solvent and the resulting mixture is cast into a film; and other conventionally known film-forming methods. The use of the extrusion method and casting method, among them, is preferred for their ability to achieve thickness reduction of a multilayer printed board as it is fabricated using the resin sheet of the present invention.

Preferably, a part or all of the layered silicate in the resin sheet of the present invention is dispersed in the form of a stack consisting of 5 or less layers and has a mean interlayer spacing of at least 3 nm along the (001) plane when measured by a wide-angle X-ray diffraction method. More preferably, it is dispersed in the form of a stack consisting of 5 or less layers and has a mean interlayer spacing of 3-5 nm.

The mean interlayer spacing of the layer silicate, as used herein, refers to a mean value of spacings between flaky crystals of the layered silicate if regarded as individual layers, and can be calculated from X-ray diffraction peaks and photographs taken using a transmission electron microscope, i.e., by a wide-angle X-ray diffraction measurement method. A proportion of the layered silicate that is dispersed in the form of a stack consisting of 5 or less layers can be determined by observing the resin sheet by a transmission electron microscope at a magnification of 50,000-100,000, measuring a total number (X) of layers of layered silicates observable in a particular area and a number (Y) of layers of layered silicates dispersed in the form of a stack consisting of 5 or less layers, and calculating from the following equation:

Proportion (%) of layered silicate that is dispersed in the form of a stack consisting of 5 or less layers=(Y/X)×100

As described above, apart or all of the layered silicate in the resin sheet is dispersed in the form of a stack consisting of 5 or less layers and has a mean interlayer spacing of at least 3 nm. This sufficiently increases interfacial areas between the epoxy resin and the layered silicate and between the epoxy hardener and the layered silicate, optimizes a distance between flaky crystals of the layered silicate and accordingly improves high-temperature physical properties, mechanical properties, heat resistance and dimensional stability of a cured product of the resin sheet. However, if a part or all of the layered silicate in the resin sheet is dispersed in the form of a stack having a mean interlayer spacing of exceeding 5 nm, the crystal flakes of the layered silicate may be separated from each other to such an extent that their interaction becomes negligibly weak. This weakens binding strength (restraining strength) at high temperature to result in the failure to improve dimensional stability of the cured product of the resin sheet sufficiently.

By "a part or all of the layered silicate in the resin sheet is dispersed in the form of a stack consisting of 5 or less layers", it is specifically meant that the interaction between flaky crystals of the layered silicate is weakened to the extent that a part or all of stacked flaky crystals is dispersed. Preferably, at least 10% of the layered silicate is dispersed in the form a stack consisting of 5 or less layers. More preferably, at least 20% of the layered silicate is dispersed in the form of a stack consisting of 5 or less layers.

In order that the aforesaid effect is sufficiently obtained as a result of dispersion of the layered silicate, it is preferred that the layered silicate when dispersed exists in the form of a stack of 5 or less layers. However, in actual practice, the aforesaid effect is sufficiently provided if the layered silicate is dispersed in the form of a stack of 3 layers or thereabound.

In order to reduce the number of layers in the stack, dispersibility of the layered silicate may be increased such as by increasing a chemical throughput, e.g., an amount of a cationic surfactant with which the layered silicate is cation exchanged. However, in this case, the cationic surfactant in the increased amount may reduce physical properties of the resin sheet. Alternatively, more severe dispersion conditions may be utilized. For example, in case dispersion is performed in an extruder, an increased shear force may be applied to the composition while extruded. In case the composition is stirred by a mixer, the number of revolutions of its rotor blades may be increased.

It is accordingly preferred that at least 30% of the layered silicate is dispersed in the form of a stack consisting of 3 or more layers. The excessive increase in proportion of such stacks consisting of 3 or more layers results in the reduced chance of obtaining the aforesaid properties. Preferably, a proportion of the layered silicate that is dispersed in the form of a stack consisting of 3 or more layers does not exceed 70%.

Because the layered silicate is dispersed in the resin sheet of the present invention in the way as described above, the respective interfacial areas between the epoxy resin and the layered silicate and between the epoxy hardener and the layered silicate are rendered sufficiently large to enhance interaction of the layered silicate at its surfaces with the epoxy resin and epoxy hardener and accordingly increase a melt viscosity of the resin sheet. This not only improves thermal processability such as on a heat pressing equipment but also improves configuration retention of a shaped structure having an emboss or other desired pattern impressed thereto.

When desired patterning is performed on the shaped structure, the layered silicate is preferably contained in the range of 0.2-40 parts by weight, based on 100 parts by weight of resin constituents including the epoxy resin and epoxy hardener. More preferably, the layered silicate is contained in the range of 0.5-20 parts by weight, further preferably in the range of 1.0-10 parts by weight. If the amount of the layered silicate is below 0.2 parts by weight, its mechanical properties after cure may decrease. If the amount of the layered silicate exceeds 40 parts by weight, the resin increases in viscosity to result in the difficulty to apply desired patterns.

In the case where the thermosetting resin composition further contains an inorganic compound other than the layered silicate, the layered silicate and the other inorganic compound are preferably incorporated in the ratio of 1:1-1:20. If this ratio is within the range of 1:1-1:20, a marked increase of a resin viscosity is prevented. Improved mechanical properties also result. Accordingly, the resin composition if containing them in the ratio of 1:1-1:20 exhibits good flow properties and becomes more applicable for built-up uses. In such cases, the resin sheet exhibits improved followability, evenness and mechanical properties.

Also, elastic modulus and other mechanical properties are improved over a wide temperature range from ordinary to high temperature. Mechanical properties are maintained even at high temperatures that exceed a glass transition temperature or melting temperature of a cured product of the resin sheet. Further, a linear expansion coefficient at high temperature can be maintained at low values. This is presumably because the layered silicate in a finely dispersed state serves in its way as pseudo-crosslink points even in a high temperature range above a glass transition temperature or melting point of a cured product of the resin sheet.

Also, the distance between flake crystals of the layered silicate is rendered to fall within a proper range, so that those flake crystals of the layered silicate, when combusted, tend to move and form a sintered body which constitutes a flame-retardant coating. Since this sintered body is formed in an early stage of combustion, it can block oxygen supply from outside as well as any combustible gas generated by combustion. Therefore, the resin sheet exhibits excellent flame-retardant properties.

Furthermore, in the resin sheet of the present invention, the layered silicate is finely dispersed on a nanometer scale. Accordingly, when a product obtained by curing the resin sheet of the present invention, e.g., a substrate is laser drilled such as by a carbon dioxide gas laser, the epoxy resin, epoxy hardener and layered silicate components are decomposed and vaporized simultaneously. Even partially-left residues of the layered silicate only have sizes of up to several μm and can be readily removed by desmear processing. This reliably reduces the occurrence of defective plating or the like that may be caused by residues left behind the drilling process.

The resin sheet of the present invention preferably exhibits a mean linear expansion coefficient ($\alpha 1$) of not exceeding $4.0 \times 10^{-5}/°$ C. over a temperature range that is 10-50° C. lower than a glass transition temperature of a cured product. If the mean linear expansion coefficient ($\alpha 1$) of the resin sheet exceeds $4.0 \times 10^{-5}/°$ C., its dimensional stability prior to being subjected to a thermal history may become insufficient.

The resin sheet of the present invention preferably exhibits a mean linear expansion coefficient ($\alpha 2$) of not exceeding $4.0 \times 10^{-5}/°$ C. over a temperature range that is 10-50° C. higher than a glass transition temperature of a cured product. If the mean linear expansion coefficient ($\alpha 2$) of the resin sheet exceeds $4.0 \times 10^{-5}/°$ C. its dimensional stability subsequent to being subjected to a thermal history may become insufficient and accordingly cause inconveniences during a high-temperature treatment such as solder reflowing.

In the resin sheet of the present invention, a cured product preferably exhibits a dielectric constant at 1 GHz of not exceeding 3.3 and a dielectric loss tangent at 1 GHz of not exceeding 0.015. If the cured product exhibits a dielectric constant of exceeding 3.3 or a dielectric loss tangent of exceeding 0.015, the dielectric properties of the resin sheet may become insufficient so that its electrical properties are impaired.

Examples of uses of the resin sheet of the present invention include, but not particularly limited to, a substrate for semiconductor packages, printed board, core layer or prepreg for multilayer printed board, substrate material forming built-up layers, sheet, laminate board, resin-bearing copper foil, copper-clad laminate, sheet or TAB tape for use in rigid flexible board, and the like.

The thermosetting resin composition, the resin sheet and the others made using this thermosetting resin composition, in accordance with the present invention, are all superior in transparency, as described above. Accordingly, when either one is used as an insulating film for electrical and electronic materials, particularly for build-up, its superior transparency not only permits easy alignment (alignment) thereof with the other laminating members, but also permits easy observation of voids due to air entrapment.

Further, the thermosetting resin composition, the resin sheet and the others made using this thermosetting resin composition, when photosensitized, are made suitable for uses such as solder resists and photosensitive plating resists useful in a full-additive process.

In such cases, a photosensitizer such as naphthoquinone azide, if necessary, is incorporated in the thermosetting resin composition preferably in the range of 10-30 parts by weight, based on 100 parts by weight of the thermosetting resin composition exclusive of the layered silicate. Incorporation of the photosensitizer within the specified range effectively increases the response of the thermosetting resin composition to irradiation. The lower loading of the layered silicate increases effectiveness of the photosensitizer incorporated. Particularly when the inorganic compounds, inclusive of the layered silicate, are incorporated in the range of 0.2-15 parts by weight, the thermosetting resin composition, the resin sheet or other made using the composition is less affected by light scattering or attenuation due to the presence of the inorganic compounds, and is more clearly patterned when it is exposed to a light.

In the case where it is used as a build-up layer or the like, the lower loading of the layered silicate increases its tendency to follow irregularities on a circuit pattern and accordingly reduces a reliability loss due to voids that results when it poorly follows such irregularities. It also improves processability in the formation of multilayers, because of its ability to provide a very flat top surface.

The following procedure can be utilized to check its followability. The resin sheet made using the thermosetting resin composition in accordance with the present invention is superimposed on a circuit-patterned substrate. A release sheet is subsequently placed on the resin sheet. The resulting stack is then pressed by a pressing machine. The followability of the resin sheet can be checked whether or not it follows a substrate surface upon application of a low pressure. The preceding procedure can be simplified by checking the amount of the resin sheet squeezed out from the pressing machine while applying a pressure. That is, the followability of the resin sheet can be checked by interposing the resin sheet between copper-bearing substrates to provide a stack and evaluating flow properties of the resin sheet from the amount of the resin sheet squeezed out from the pressing machine while applying a pressure to the stack.

Also in the thermosetting resin composition according to the present invention, mechanical properties are improved by the layered silicate while extensibility is improved by the resin constituents. Accordingly, production of cracks is restrained during cooling and heating cycles.

The layered silicate is preferably loaded in the range of 0.2-15 parts by weight, more preferably in the range of 0.5-10 parts by weight, based on 100 parts by weight of the thermoplastic resin composition, in order to further enhance mechanical properties and extensibility in particular. If the loading of the layered silicate exceeds 15 parts by weight, extensibility becomes low. If the loading of the layered silicate is below 0.2 parts by weight, mechanical properties such as a linear expansion coefficient may deteriorate.

The thermosetting resin composition according to the present invention has a lower specific gravity and thus lighter weight than a similar composition which exhibits comparable mechanical properties with the use of other inorganic filler such as silica, making it more suitable for use in a circuit board for portable telephones that continue to demand weight reduction.

The resin sheet for insulating substrate, according to the present invention, is made using the resin sheet of the present invention. That is, the resin sheet for insulating substrate, according to the present invention, is made by curing the resin sheet of the present invention.

The following examples illustrate the practice of the present invention in more detail but are not intended to be limiting thereof.

In the following examples, the below-listed materials were used.

1. Epoxy Resin (1) Bisphenol A epoxy resin (product name "YD-8125", epoxy equivalent weight: 175, product of Tohto Kasei Co., Ltd.

(2) Solid epoxy resin (product name "YP-55", epoxy equivalent weight: 13,700, product of Tohto Kasei Co., Ltd.)

(3) Biphenyl epoxy resin (product name "NC-3000H", product of Nippon Kayaku K.K.)

(4) Naphthalene epoxy resin (product name "HP-4032", product of Dainippon Ink & Chemicals, Inc.)

2. Epoxy Hardener (1) Epoxy hardener comprising the hydrophobic phenol compound as represented by the preceding formula (1) (product name "PP-1000-240", product of Nippon Petrochemicals Co., Ltd.)

(2) Dicyandiamide (product name "EH-3636S", product of Asahi Denka Kogyo Co., Ltd.)

(3) Imidazole (product name "EH-3366S", product of Asahi Denka Kogyo Co., Ltd.)

(4) Epoxy hardener comprising the hydrophobic phenol compound as represented by the preceding formula (3) wherein $R^3$ denotes a group represented by the formula (4a), $R^4$ denotes a group represented by the formula (5c), $R^5$ denotes a group represented by the formula (6a) and $R^6$ denotes hydrogen (product name "MEH-7851H", product of Meiwa Plastic Industries, Ltd.)

(5) Epoxy hardener comprising the hydrophobic phenol compound as represented by the preceding formula (3) wherein $R^3$ denotes a group represented by the formula (4a), $R^4$ denotes a group represented by the formula (5a), $R^5$ denotes a group represented by the formula (6a) and $R^6$ denotes hydrogen (product name "MEH-7800H", product of Meiwa Plastic Industries, Ltd.)

(6) Epoxy hardener comprising the hydrophobic phenol compound as represented by the preceding formula (2) (product name "DPP-6125", product of Nippon Petrochemicals Co., Ltd.)

3. Layered Silicate

Synthetic hectorite chemically treated with a trioctylmethylammonium salt (product name "Lucentite STN", product of CO-OP Chemical Co., Ltd.)

4. Organic Solvent

N,N-dimethylformamide (DMF, guaranteed grade, product of Wako Pure Chemicals Industries, Ltd.)

5. Cure Promoter

Triphenylphosphine (product of Wako Pure Chemicals Industries, Ltd.)

6. Inorganic Compound

Silica (product name "KE-S50", product of Nippon Shokubai Co., Ltd.)

7. Engineering Plastic

Polysulfone resin (product name "A-300", product of Solvay Advanced Polymers)

Example 1

14.4 g of synthetic hectorite "Lucentite STN" and 197.2 g of DMF were mixed and stirred at normal temperature to complete homogeneity. Thereafter, 10.0 g of a bisphenol A epoxy resin "YD-8125" was introduced and stirred at normal temperature to obtain a completely homogeneous solution. Next, 23.5 g of an epoxy hardener comprised of a hydrophobic phenol compound "PP-1000-240" was introduced into the solution and stirred at normal temperature to complete homogeneity to prepare a thermosetting resin composition solution.

The above-obtained thermosetting resin composition solution was coated using an applicator onto a release-treated, transparent polyethylene terephthalate (PET) film (product name "PET5011 550", 50 μm thick, product of Lintec Corp.) to a dry film thickness of 50 μm and dried in a GEER oven at 100° C. for 12 minutes to prepare a 200 mm×200 mm×50 μm resin sheet which remained uncured. This uncured product of the resin sheet was then heated in a GEER oven at 170° C. for 1 hour to obtain a cured product of the resin sheet.

Examples 2 and 3 and Comparative Examples 1-3

The procedure of Example 1 was followed, except that a formulation of the thermosetting resin composition solution was varied as specified in Table 1, to prepare thermosetting resin composition solutions, and uncured and cured resin sheets.

Example 4

50.0 g of a biphenyl epoxy resin "NC-3000H", 47.0 g of an epoxy hardener "MEH-7851H", 3.0 g of synthetic hectorite "Lucentite STN", 0.3 g of triphenylphosphine and 150.0 g of DMF were charged into a beaker. After an hour of stirring by a stirrer, the beaker contents were degassed to obtain a resin/layered silicate solution. This resin/layered silicate solution was coated onto a polyethylene terephthalate sheet, desolvated and heated at 100° C. for 15 minutes to prepare a test sheet comprising an uncured product of the resin composition. The obtained test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 μm and 2 mm in thickness.

Example 5

48.0 g of a biphenyl epoxy resin "NC-3000H", 45.0 g of an epoxy hardener "MEH-7851H", 7.0 g of synthetic hectorite "Lucentite STN", 0.3 g of triphenylphosphine and 186.0 g of DMF were charged into a beaker. After an hour of stirring by a stirrer, the beaker contents were degassed to obtain a resin/layered silicate solution. This resin/layered silicate solution was coated onto a polyethylene terephthalate sheet, desolvated and heated at 100° C. for 15 minutes to prepare a test sheet comprising an uncured product of the resin composition. The obtained test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 μm and 2 mm in thickness.

Example 6

51.0 g of a biphenyl epoxy resin "NC-3000H", 42.0 g of an epoxy hardener "MEH-7800H", 7.0 g of synthetic hectorite "Lucentite STN", 0.3 g of triphenylphosphine and 186.0 g of DMF were charged into a beaker. After an hour of stirring by a stirrer, the beaker contents were degassed to obtain a resin/layered silicate solution. This resin/layered silicate solution was coated onto a polyethylene terephthalate sheet, desolvated and heated at 100° C. for 15 minutes to prepare a test sheet comprising an uncured product of the resin composition. The obtained test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 μm and 2 mm in thickness.

Example 7

0.46 g of synthetic hectorite "Lucentite STN" and 22.87 g of DMF were mixed and stirred at normal temperature to complete homogeneity. After stirring, 10.00 g of a bisphenol A epoxy resin "YD-8125" was introduced and then stirred at normal temperature to obtain a completely homogeneous solution. Next, 12.34 g of a phenolic hardener "MEH-7851H" was introduced into the solution and stirred by a stirrer at normal temperature for 1 hour to complete homogeneity. The resulting solution was subsequently degassed to obtain a resin/layered silicate solution. The obtained resin/layered silicate solution was coated onto a polyethylene terephthalate sheet, desolvated and then heated at 100° C. for 15 minutes to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 μm and 2 mm in thickness.

Example 8

0.46 g of synthetic hectorite "Lucentite STN", 5.70 g of silica "KE-S50" and 34.83 g of DMF were mixed and stirred at normal temperature to complete homogeneity. After stirring, 10.00 g of a bisphenol A epoxy resin "YD-8125" was introduced and then stirred at normal temperature to obtain a completely homogeneous solution. Next, 12.34 g of an epoxy hardener "MEH-7851H" was introduced into the solution and stirred by a stirrer at normal temperature for 1 hour to complete homogeneity. The resulting solution was subsequently degassed to obtain a resin/layered silicate solution. This resin/layered silicate solution was coated onto a polyethylene terephthalate sheet, desolvated and then heated at 100° C. for 15 minutes to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 μm and 2 mm in thickness.

Example 9

1.28 g of synthetic hectorite "Lucentite STN" and 41.90 g of DMF were mixed and stirred at normal temperature to complete homogeneity. After stirring, 10.00 g of a naphthalene epoxy resin "HP-4032" was introduced and then stirred at normal temperature to obtain a completely homogeneous solution. Next, 14.40 g of an epoxy hardener "MEH-7851H" was introduced into the solution and stirred by a stirrer at normal temperature for 1 hour to complete homogeneity. The resulting solution was subsequently degassed to obtain a resin/layered silicate solution. The obtained resin/layered silicate solution was coated onto a polyethylene terephthalate sheet, desolvated and then heated at 100° C. for 15 minutes to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 μm and 2 mm in thickness.

Example 10

1.18 g of synthetic hectorite "Lucentite STN" and 54.11 g of DMF were mixed and stirred at normal temperature to complete homogeneity. After stirring, 10.00 g of a naphthalene epoxy resin "HP-4032" was introduced and then stirred at normal temperature to obtain a completely homogeneous solution. Next, 28.00 g of an epoxy hardener "PP-1000-240"

was introduced into the solution and stirred by a stirrer at normal temperature for 1 hour to complete homogeneity. The resulting solution was subsequently degassed to obtain a resin/layered silicate solution. The obtained resin/layered silicate solution was coated onto a polyethylene terephthalate sheet, desolvated and then heated at 100° C. for 15 minutes to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 µm and 2 mm in thickness.

Example 11

0.69 g of synthetic hectorite "Lucentite STN" and 31.79 g of DMF were mixed and stirred at normal temperature to complete homogeneity. After stirring, 10.00 g of a naphthalene epoxy resin "HP-4032" was introduced and then stirred at normal temperature to obtain a completely homogeneous solution. Next, 12.33 g of an epoxy hardener "DPP-6125" was introduced into the solution and stirred by a stirrer at normal temperature for 1 hour to complete homogeneity. The resulting solution was subsequently degassed to obtain a resin/layered silicate solution. The obtained resin/layered silicate solution was coated onto a polyethylene terephthalate sheet, desolvated and then heated at 100° C. for 15 minutes to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 µm and 2 mm in thickness.

Example 12

2.52 g of synthetic hectorite "Lucentite STN" and 120.1 g of DMF were mixed and stirred at normal temperature to complete homogeneity. After stirring, 10.00 g of a bisphenol A epoxy resin "YD-8125" was introduced and then stirred at normal temperature to obtain a completely homogeneous solution. Next, 23.50 g of an epoxy hardener "PP-1000-240" was introduced into the solution and stirred by a stirrer at normal temperature for 1 hour to complete homogeneity. The resulting solution was subsequently degassed to obtain a resin/layered silicate solution. The obtained resin/layered silicate solution was coated onto a polyethylene terephthalate sheet, desolvated and then heated at 100° C. for 15 minutes to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 µm and 2 mm in thickness.

Example 13

3.0 g of synthetic hectorite "Lucentite STN", 20.0 g of silica "KE-S50" and 168.0 g of DMF were mixed and stirred at normal temperature to complete homogeneity. After stirring, 40.00 g of a biphenyl epoxy resin "NC-3000H" and 0.3 g of triphenylphosphine were introduced and then stirred at normal temperature to obtain a completely homogeneous solution. Next, 37.00 g of an epoxy hardener "MEH-7851H" was introduced into the solution and stirred by a stirrer at normal temperature for 1 hour to complete homogeneity. The resulting solution was subsequently degassed to obtain a resin/layered silicate solution. This resin/layered silicate solution was coated onto a polyethylene terephthalate sheet, desolvated and then heated at 100° C. for 15 minutes to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 µm and 2 mm in thickness.

Example 14

1.28 g of synthetic hectorite "Lucentite STN" and 41.90 g of DMF were mixed and stirred at normal temperature to complete homogeneity. After stirring, 10.00 g of a naphthalene epoxy resin "HP-4032" was introduced and then stirred at normal temperature to obtain a completely homogeneous solution. Next, 14.40 g of an epoxy hardener "MEH-7851H" and 4.90 g of a polysulfone resin "A-300" were introduced into the solution and stirred by a stirrer at normal temperature for 1 hour to complete homogeneity. The resulting solution was subsequently degassed to obtain a resin/layered silicate solution. The obtained resin/layered silicate solution was coated onto a polyethylene terephthalate sheet, desolvated and then heated at 100° C. for 15 minutes to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating at 180° C. for 3 hours to prepare plate-shaped structures each comprising the resin composition and respectively measuring 100 µm and 2 mm in thickness.

Comparative Example 4

The procedure of Example 13 was followed, except that the layered silicate was excluded and the loadings of the silica "KE-S50" and DMF were changed to 23.0 g and 150 g, respectively, to prepare a test sheet comprising an uncured product of the resin composition. The test sheets were laminated to prepare a 1 mm thick, plate-shaped structure for use in the measurement of a melt viscosity of the uncured product. Further, the uncured test sheet and the laminate were cured by heating them at 180° C. for 3 hours to prepare plate-shaped structures each comprising the resin composition and respectively measuring 100 µm and 2 mm in thickness.

(Items and Procedures Used to Evaluate Examples 1-4 and Comparative Examples 1-4)

The following procedures were utilized to evaluate performances of the thermosetting resin composition solutions and resin sheets obtained in Examples 1-4 and Comparative Examples 1-4. Their performances were evaluated on the basis of the following items; 1. dielectric constant, 2. dielectric loss tangent, 3. mean linear expansion coefficient ($\alpha 1$), 4. mean linear expansion coefficient ($\alpha 2$), 5. mean interlayer spacing of layered silicate, 6. layered silicate dispersed in the form of a stack consisting of 5 or less layers, 7. layered silicate dispersed in the form of a stack consisting of 3 or more layers, 8. breaking strength, 9. elongation at break and 10. percentage of resin flow.

1. Dielectric Constant & 2. Dielectric Loss Tangent

The cured product of the resin sheet was cut into 15 mm×15 mm pieces. Eight of those were arranged above each other to provide a 400 μm thick laminate. Its dielectric constant and dielectric loss tangent at 1 GHz were measured at normal temperature using a dielectric constant measuring device (model No. "HP-4291B", product of Hewlett Packard).

3. Mean Linear Expansion Coefficient ($\alpha$1) & 4. Mean Linear Expansion Coefficient ($\alpha$2)

The cured product of the resin sheet was cut into 3 mm×25 mm samples. Its mean linear expansion coefficient (a 1) over a temperature range 10-50° C. lower than a glass transition temperature of the cured product, as well as its mean linear expansion coefficient ($\alpha$2) over a temperature range 10-50° C. higher than the glass transition temperature of the cured product, were measured using a linear expansion coefficient meter (model No. "TMA/SS120C", product of Seiko Instruments Inc.) under the conditions of a tensile load of $2.94 \times 10^{-2}$ N and a temperature rise rate of 5° C./min.

5. Mean Interlayer Spacing of Layered Silicate

Each thermosetting resin composition solution was coated using an applicator onto a release-treated, transparent PET film "PET5011 550" to a dry film thickness of 200 μm and then dried in a GEER oven at 100° C. for 12 minutes to prepare a 200 mm×200 mm×200 μm resin sheet which remained uncured. 10 of these uncured resin sheets were pressed and then heated in a GEER oven at 170° C. for 1 hour to prepare a cured product of the resin sheet which measured 2 mm in thickness. Next, for the cured product of resin sheet measuring 2 mm in thickness, 2θ at diffraction peaks was measured from diffraction of an X-ray on a surface of the layered silicate that extended along a plane of lamination, using an X-ray diffraction measurement instrument (model No. "RINT 1100", product of Rigaku Industrial Corp.). The separation d of the (001) planes of the layered silicate was calculated from the following Bragg's diffraction equation and the value obtained for d was taken as a mean interlayer spacing (nm):

$$\lambda = 2d \sin \theta$$

wherein λ is 0.154 (nm) and θ represents a diffraction angle.

6. Layered Silicate Dispersed in the Form of a Stack Consisting of 5 or Less Layers & 7. Layered Silicate Dispersed in the Form of a Stack Consisting of 3 or More Layers The procedure of the preceding item 5 was followed to prepare a cured product of resin sheet measuring 100 μm in thickness. This cured product was observed by a transmission electron microscope at a magnification of 100,000 to check the dispersed condition of the layered silicates. Out of a total number (X) of layers of the layered silicates observable in a particular area, a number (Y) of layers of the layered silicates dispersed in the form of a stack consisting of 5 or less layers and a number (Z) of layers of the layered silicates dispersed in the form of a stack consisting of 3 or more layers were measured. The proportion (%) of the layered silicate that was dispersed in the form of a stack consisting of 5 or less layers, as well as the proportion (%) of the layered silicate that was dispersed in the form of a stack consisting of 3 or more layers, were calculated from the following equation to evaluate the dispersed condition of the layered silicate according to the following evaluation standard.

Proportion (%) of layered silicate that is dispersed in the form of a stack consisting of 5 or less layers=(Y/X)×100

[Evaluation Standard]

○ ... Proportion of layered silicate that is dispersed in the form of a stack consisting of 5 or less layers was at least 10%.

x ... Proportion of layered silicate that is dispersed in the form of a stack consisting of 5 or less layers was below 10%.

Proportion (%) of layered silicate that is dispersed in the form of a stack consisting of 3 or more layers=(Z/X)×100

[Evaluation Standard]

○ ... Proportion of layered silicate that is dispersed in the form of a stack consisting of 3 or more layers was not less than 30% but not greater than 70%.

x ... Proportion of layered silicate that is dispersed in the form of a stack consisting of 3 or more layers was less than 30% or greater than 70%.

8. Breaking Strength & 9. Elongation at Break

The cured product of the resin sheet, measuring 100 μm in thickness, was cut into a 10×80 mm size. Its breaking strength (MPa) and elongation (%) at break were measured by a tensile test using a tensile testing machine (product name "Tensilon", product of Orientec Co., Ltd.) under the conditions of an interchuck interval of 60 mm and a crosshead speed of 5 mm/min.

10. Percentage of Resin Flow

A 40 mm thick resin sheet cut into a predetermined size (80 mm×80 mm), copper-clad laminates each having opposite copper surfaces (product name "CS 3665 (35/35)", product of Risho Kogyo Co., Ltd.) and two release sheets each cut into a size larger than the resin sheet were prepared.

The copper surfaces of each copper-clad laminate were 2 μm etched using an etching solution (product name "Mech Etchbond CZ8101", product of Mech Corp.) under conditions of a temperature of 35 5° C., a spray pressure of 0.15 MPa and a treating time of 60 seconds.

Next, the resin sheet and copper-clad laminates were weighed. The copper-clad laminates were arranged to interpose the resin sheet therebetween and their respective outer sides were covered with the release sheets. The resulting stack was set in a heat pressing machine and then maintained under heat and pressure conditions (150° C./2 MPa) for 30 seconds so that resin flow was caused to occur.

After removal from the heat pressing machine, the stack was cooled. Thereafter, the release sheets were removed from the stack. Then, cutting was applied precisely along outer edges of the copper-clad laminates to cut out the copper-clad laminates adhesively securing the resin sheet therebetween. After cutting, this combination was weighed. The resin flow was calculated by the difference in weigh of the combination prior to and subsequent to application of heat pressing. A percentage of resin flow was calculated by the ratio of the resin flow to the original weight of the resin sheet previously measured.

If the percentage of resin flow ranges from 1% up to 20% (optimally about 10%), the resin shows improved filling to an underlying pattern and leveling that lead to the improved yield of circuit patterns formed thereon. On the other hand, if the percentage of resin flow exceeds 20%, a marked thickness variation of the resin sheet becomes more likely to occur. This affects layer insulation and propagation delay.

(Evaluation Results of Examples 1-14 and Comparative Examples 1-4)

The evaluation results of Examples 1-3 and Comparative Example 4 are listed in the following Table 1. The evaluation results of Examples 4-14 and Comparative Example 4 are listed in the following Tables 2 and 3.

TABLE 1

Load Unit of Component in Thermosetting Resin Composition Solution (g)

|  |  |  | Ex. | | | Comp. Ex. | | |
| --- | --- | --- | --- | --- | --- | --- | --- | --- |
|  |  |  | 1 | 2 | 3 | 1 | 2 | 3 |
| Thermosetting Resin Composition Solution (g) | Epoxy Resin | Bisphenol A Epoxy Resin | 10.0 | 10.0 | 10.0 | 10.0 | — | 35.0 |
|  |  | Solid Epoxy Resin | — | — | 10.0 | — | 10.0 | 35.0 |
|  | Epoxy Hardener | Phenol Compound PP-1000-240 | 23.5 | 18.8 | 19.1 | 23.5 | 18.8 | — |
|  |  | Dicyandiamide | — | 0.14 | — | — | 0.14 | 2.45 |
|  |  | Imidazole | — | 0.06 | — | — | 0.06 | 1.05 |
|  | Layered Silicate | Synthetic Hectorite | 14.4 | 19.3 | 16.7 | — | 19.3 | 30.0 |
|  | Organic Solvent | DMF | 197.2 | 198.7 | 173.0 | 197.2 | 198.7 | 214.3 |
| Performance Evaluation Results | 1. Dielectric Constant (Frequency 1 GHz) | | 3.0 | 3.0 | 3.0 | 3.1 | 3.2 | 3.2 |
|  | 2. Dielectric Loss Tangent (Frequency 1 GHz) | | 0.010 | 0.011 | 0.014 | 0.016 | 0.018 | 0.019 |
|  | 3. Mean Linear Expansion Coefficient ($\alpha 1$): $\times 10^{-5}/°$ C. | | 2.7 | 2.5 | 3.4 | 11.5 | 12.1 | 5.1 |
|  | 4. Mean Linear Expansion Coefficient ($\alpha 2$): $\times 10^{-5}/°$ C. | | 1.5 | 2.4 | 1.9 | 290 | 20.5 | 7.5 |
|  | 5. Mean Interlayer Spacing of Layered Silicate (nm) | | >3.5 | >3.5 | >3.5 | — | >3.5 | >3.5 |
|  | 6. Layered Silicate Dispersed in the Form of a Stack Consisting of 5 or Less Layers | | ○ | ○ | ○ | — | ○ | ○ |
|  | 7. Layered Silicate Dispersed in the Form of a Stack Consisting of 3 or More Layers | | ○ | ○ | ○ | — | ○ | ○ |
|  | 8. Breaking Strength (MPa) | | 83 | 81 | 84 | 61 | 45 | 81 |
|  | 9. Elongation at Break (%) | | 2.4 | 2 | 2.5 | 5.5 | 3.6 | 3.8 |
|  | 10. Percentage of Resin Flow | | — | — | — | 35.4 | — | — |

TABLE 2

Load Unit of Component in Thermosetting Resin Composition Solution (g)

|  |  |  | Ex. | | | | | | | |
| --- | --- | --- | --- | --- | --- | --- | --- | --- | --- | --- |
|  |  |  | 4 | 5 | 6 | 7 | 8 | 9 | 10 | 11 |
| Thermosetting Resin Composition Solution (g) | Epoxy Resin | Bisphenol A Epoxy Resin | — | — | — | 10.00 | 10.00 | — | — | — |
|  |  | Biphenyl Epoxy Resin | 50 | 48 | 51 | — | — | — | — | — |
|  |  | Naphthalene Epoxy Resin | — | — | — | — | — | 10.00 | 10.00 | 10.00 |
|  | Epoxy Hardener | Phenol Compound PP-1000-240 | — | — | — | — | — | — | 28.00 | — |
|  |  | Phenol Compound MEH7851H | 47 | 45 | — | 12.34 | 12.34 | 14.40 | — | — |
|  |  | Phenol Compound MEH7800H | — | — | 42 | — | — | — | — | — |
|  |  | Phenol Compound DPP-6125 | — | — | — | — | — | — | — | 12.33 |
|  | Layered Silicate | Synthetic Hectorite | 3 | 7 | 7 | 0.46 | 0.46 | 1.28 | 1.18 | 0.69 |
|  | Organic Solvent | DMF | 150 | 186 | 186 | 22.87 | 34.83 | 41.90 | 54.11 | 31.79 |
|  | Cure Promoter | Triphenylphosphine | 0.3 | 0.3 | 0.3 | — | — | — | — | — |
|  | Inorganic Compound | Silica | — | — | — | — | 5.70 | — | — | — |

TABLE 2-continued

Load Unit of Component in Thermosetting Resin Composition Solution (g)

| | | Ex. | | | | | | | |
|---|---|---|---|---|---|---|---|---|---|
| | | 4 | 5 | 6 | 7 | 8 | 9 | 10 | 11 |
| Performance Evaluation Results | 1. Dielectric Constant (Frequency 1 GHz) | 3.2 | 3.2 | 3.2 | 3.3 | 3.3 | 3.3 | 2.9 | 3.3 |
| | 2. Dielectric Loss Tangent (Frequency 1 GHz) | 0.013 | 0.012 | 0.013 | 0.018 | 0.015 | 0.015 | 0.013 | 0.016 |
| | 3. Mean Linear Expansion Coefficient ($\alpha 1$): $\times 10^{-5}/°$ C. | 6.5 | 5.9 | 5.8 | 7.0 | 6.0 | 6.0 | 7.0 | 6.1 |
| | 4. Mean Linear Expansion Coefficient ($\alpha 2$): $\times 10^{-5}/°$ C. | 7.5 | 7.0 | 7.0 | 10.5 | 8.0 | 9.5 | 8.0 | 7.0 |
| | 5. Mean Interlayer Spacing of Layered Silicate (nm) | >3.5 | >3.5 | >3.5 | >3.5 | >3.5 | >3.5 | >3.5 | >3.5 |
| | 6. Layered Silicate Dispersed in the Form of a Stack Consisting of 5 or Less Layers | ○ | ○ | ○ | ○ | ○ | ○ | ○ | ○ |
| | 7. Layered Silicate Dispersed in the Form of a Stack Consisting of 3 or More Layers | ○ | ○ | ○ | ○ | ○ | ○ | ○ | ○ |
| | 8. Breaking Strength (MPa) | 83 | 86 | 89 | 80 | 82 | 85 | 80 | 88.5 |
| | 9. Elongation at Break (%) | 9.5 | 7.1 | 9.1 | 10.5 | 8.5 | 10.0 | 8.0 | 6.5 |
| | 10. Percentage of Resin Flow | 6.5 | 1.2 | 1.0 | 17.8 | 15.9 | 12.6 | 11.4 | 14.3 |

TABLE 3

Load Unit of Component in Thermosetting Resin Composition Solution (g)

| | | | Ex. | | | Comp. Ex. |
|---|---|---|---|---|---|---|
| | | | 12 | 13 | 14 | 4 |
| Thermosetting Resin Composition Solution (g) | Epoxy Resin | Bisphenol A Epoxy Resin | — | — | — | — |
| | | Biphenyl Epoxy Resin | 40 | 50 | — | 40 |
| | | Naphthalene Epoxy Resin | — | — | 10.00 | — |
| | Epoxy Hardener | Phenol Compound PP-1000-240 | — | 23.5 | — | — |
| | | Phenol Compound MEH7851H | 37 | — | 14.40 | 37 |
| | | Phenol Compound MEH7800H | — | — | — | — |
| | | Phenol Compound DPP-6125 | — | — | — | — |
| | Engineering Plastics | Polysulfone Resin | — | — | 4.90 | — |
| | Layered Silicate | Synthetic Hectorite | 7.0 | 0.46 | 1.28 | — |
| | Organic Solvent | DMF | 150 | 34.8 | 41.90 | 150 |
| | Cure Promoter | Triphenylphosphine | 0.3 | — | — | 0.3 |
| | Inorganic Compound | Silica | 23 | — | — | 23 |
| Performance Evaluation Results | 1. Dielectric Constant (Frequency 1 GHz) | | 3.1 | 3.2 | 3.1 | 3.2 |
| | 2. Dielectric Loss Tangent (Frequency 1 GHz) | | 0.014 | 0.012 | 0.012 | 0.012 |
| | 3. Mean Linear Expansion Coefficient ($\alpha 1$): $\times 10^{-5}/°$ C. | | 6.0 | 9.5 | 5.8 | 9.5 |
| | 4. Mean Linear Expansion Coefficient ($\alpha 2$): $\times 10^{-5}/°$ C. | | 8.0 | 24.0 | 9.6 | 24.0 |
| | 5. Mean Interlayer Spacing of Layered Silicate (nm) | | >3.5 | — | >3.5 | — |
| | 6. Layered Silicate Dispersed in the Form of a Stack Consisting of 5 or Less Layers | | ○ | ○ | ○ | — |
| | 7. Layered Silicate Dispersed in the Form of a Stack Consisting of 3 or More Layers | | ○ | ○ | ○ | — |
| | 8. Breaking Strength (MPa) | | 73 | 65 | 86 | 65 |
| | 9. Elongation at Break (%) | | 7.0 | 8.1 | 9.3 | 8.1 |
| | 10. Percentage of Resin Flow | | 7.3 | 18.3 | 11.3 | 18.3 |

The invention claimed is:

1. A thermosetting resin composition characterized as containing an epoxy resin having an epoxy equivalent weight of 100-2,000, an epoxy hardener in the form of a compound having a phenol group, and a layered silicate in the amount of 0.2-100 parts by weight, based on 100 parts by weight of resin constituents including said epoxy resin and epoxy hardener, and wherein said epoxy hardener comprises at least one type selected from the group consisting of hydrophobic phenol compounds represented by the following formulas (1) and (3):

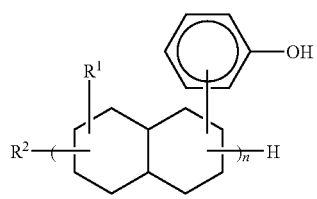
(1)

($R^1$ denotes methyl or ethyl, $R^2$ denotes hydrogen or a hydrocarbon group and n indicates an integer of 2-4),

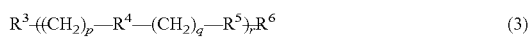
(3)

($R^3$ denotes a group represented by the following formula (4a) or (4b):

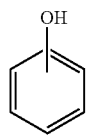
(4a)

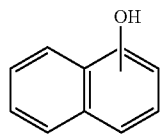
(4b)

$R^4$ denotes a group represented by the following formula (5a), (5b) or (5c):

(5a)

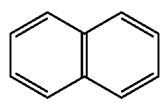
(5b)

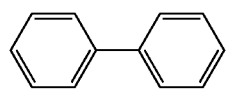
(5c)

$R^5$ denotes a group represented by the following formula (6a) or (6b):

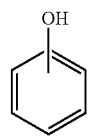
(6a)

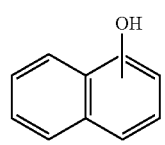
(6b)

$R^6$ denotes hydrogen or a molecular chain group containing 1-20 carbon atoms, p and q independently indicate an integer of 1-6, and r indicates an integer of 1-11).

2. The thermosetting resin composition as recited in claim 1, characterized in that said epoxy resin contains at least one type selected from the group consisting of a bisphenol epoxy resin, biphenyl epoxy resin, dicyclopentadiene epoxy resin and naphthalene epoxy resin.

3. The thermosetting resin composition as recited in claim 1, characterized in that said layered silicate comprises at least one type selected from the group consisting of montmorillonite, hectorite, swelling mica and vermiculite.

4. The thermosetting resin composition as recited in claim 1, characterized in that said layered silicate contains at least one type of ammonium salt selected from the group consisting of alkyl ammonium salt containing 6 or more carbon atoms, aromatic quaternary ammonium salt and heterocyclic quaternary ammonium salt.

5. A resin sheet characterized as comprising the thermosetting resin composition as recited in any one of claims 1, 2, 3 and 4.

6. A resin sheet characterized in that it is obtained by curing the resin sheet as recited in claim 5.

7. The resin sheet as recited in claim 5, characterized in that a part or all of said layered silicate is dispersed in the form of a stack consisting of 5 or less layers and has a mean interlayer spacing of at least 3 nm along the (001) plane when measured by a wide-angle X-ray diffraction method.

8. The resin sheet as recited in claim 5, characterized in that it exhibits a mean linear expansion coefficient ($\alpha 1$) of not exceeding $4.0 \times 10^{-5}/°$ C. over a temperature range that is 10-50° C. lower than a glass transition temperature of a cured product of said thermosetting resin composition.

9. The resin sheet as recited in claim 5, characterized in that it exhibits a mean linear expansion coefficient ($\alpha 2$) of not exceeding $4.0 \times 10^{-5}/°$ C. over a temperature range that is 10-50° C. higher than a glass transition temperature of a cured product of said thermosetting resin composition.

10. The resin sheet as recited in claim 5, characterized in that a cured product of said thermosetting resin composition exhibits a dielectric constant at 1 GHz of not exceeding 3.3 and a dielectric loss tangent at 1 GHz of not exceeding 0.015.

11. A resin sheet for insulating substrate, characterized as comprising the resin sheet as recited in claim 5.

* * * * *